US009312042B2

(12) United States Patent
Sewell et al.

(10) Patent No.: US 9,312,042 B2
(45) Date of Patent: Apr. 12, 2016

(54) METAL SEED LAYER FOR SOLAR CELL CONDUCTIVE CONTACT

(71) Applicants: Richard Hamilton Sewell, Los Altos, CA (US); Jacob Huffman Woodruff, Scottsdale, AZ (US)

(72) Inventors: Richard Hamilton Sewell, Los Altos, CA (US); Jacob Huffman Woodruff, Scottsdale, AZ (US)

(73) Assignee: SunPower Corporation, San Jose, CA (US)

( * ) Notice: Subject to any disclaimer, the term of this patent is extended or adjusted under 35 U.S.C. 154(b) by 162 days.

(21) Appl. No.: 14/039,548

(22) Filed: Sep. 27, 2013

(65) Prior Publication Data

US 2015/0090325 A1 Apr. 2, 2015

(51) Int. Cl.
| | | |
|---|---|---|
| *H01L 31/044* | (2014.01) | |
| *H01B 1/02* | (2006.01) | |
| *H01L 31/0224* | (2006.01) | |
| *H01L 31/068* | (2012.01) | |
| *H01L 31/0745* | (2012.01) | |

(52) U.S. Cl.
CPC ........ *H01B 1/023* (2013.01); *H01L 31/022441* (2013.01); *H01L 31/0682* (2013.01); *H01L 31/0745* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | | |
|---|---|---|---|
| 2004/0200520 A1* | 10/2004 | Mulligan et al. | 136/256 |
| 2010/0029077 A1* | 2/2010 | Barr et al. | 438/652 |
| 2013/0213469 A1* | 8/2013 | Kramer et al. | 136/256 |

OTHER PUBLICATIONS

MacAskill, et al. "Effects of magnesium, tin and nitrogen on the sintering response of aluminum powder," Journal of Materials Processing Technology, 210 (2010) 2252-2260.

* cited by examiner

*Primary Examiner* — Bach Dinh
(74) *Attorney, Agent, or Firm* — Blakely Sokoloff Taylor Zafman LLP

(57) ABSTRACT

Metal seed layers for solar cell conductive contacts and methods of forming metal seed layers for solar cell conductive contacts are described. For example, a solar cell includes a substrate. A semiconductor region is disposed in or above the substrate. A conductive contact is disposed on the semiconductor region and includes a seed layer in contact with the semiconductor region. The seed layer is composed of aluminum (Al) and a second, different, metal.

8 Claims, 8 Drawing Sheets

US 9,312,042 B2

METAL SEED LAYER FOR SOLAR CELL CONDUCTIVE CONTACT

TECHNICAL FIELD

Embodiments of the present disclosure are in the field of renewable energy and, in particular, metal seed layers for solar cell conductive contacts and methods of forming metal seed layers for solar cell conductive contacts.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
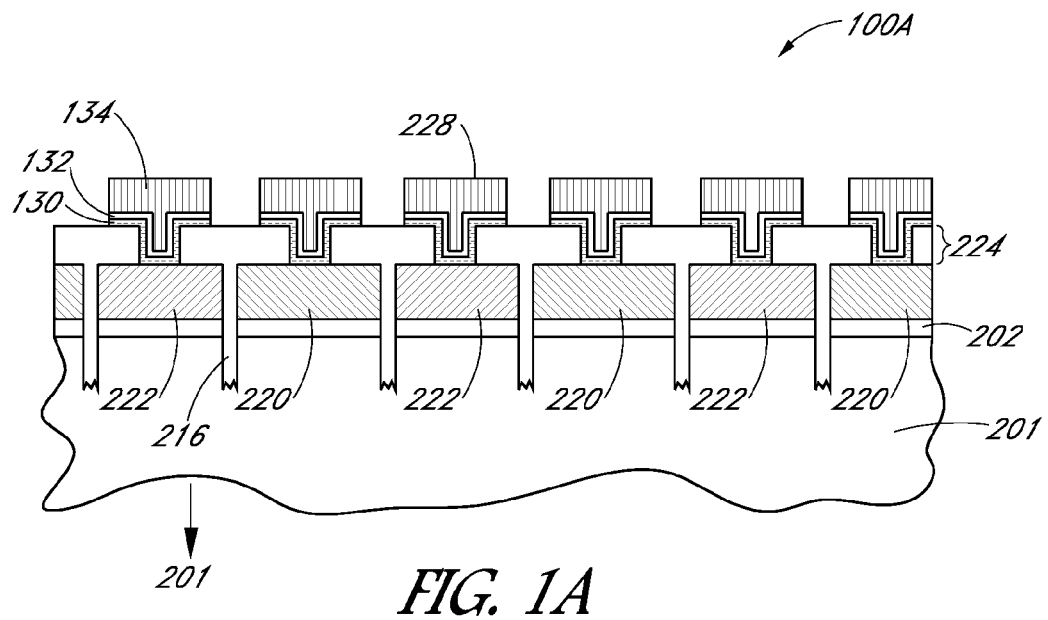
FIG. 1A illustrates a cross-sectional view of a portion of a solar cell having conductive contacts formed on emitter regions formed above a substrate, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Metal seed layers for solar cell conductive contacts and methods of forming metal seed layers for solar cell conductive contacts are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells having conductive contacts. In an embodiment, a solar cell includes a substrate. A semiconductor region is disposed in or above the substrate. A conductive contact is disposed on the semiconductor region and includes a seed layer in contact with the semiconductor region. The seed layer is composed of aluminum (Al) and a second, different, metal.

In another embodiment, a solar cell includes a substrate. A semiconductor region is disposed in or above the substrate. A conductive contact is disposed on the semiconductor region and includes a seed layer in contact with the semiconductor region. The seed layer is composed of aluminum (Al) and germanium (Ge).

In yet another embodiment, a solar cell includes a substrate. A semiconductor region is disposed in or above the substrate. A conductive contact is disposed on the semiconductor region and includes a seed layer in contact with the semiconductor region. The seed layer is composed of aluminum/silicon (Al/Si) particles, and the conductive contact has a specific contact resistivity less than approximately 12 mOhm·cm². In one such embodiment, the seed layer is composed of aluminum/silicon (Al/Si) particles, and the conductive contact has a specific contact resistivity less than approximately 8 mOhm·cm².

Also disclosed herein are methods of fabricating solar cells having conductive contacts. In an embodiment, a method of fabricating a solar cell involves forming a metal seed paste on a semiconductor region disposed in or above a substrate, the metal seed paste composed of aluminum (Al) and a second, different, metal, and the semiconductor region composed of monocrystalline or polycrystalline silicon. The metal seed paste is fired to form a metal seed layer. A conductive contact for the semiconductor region of the solar cell is formed from the metal seed layer.

In another embodiment, a method of fabricating a solar cell involves forming a metal seed paste on a semiconductor region disposed in or above a substrate, the metal seed paste composed of aluminum (Al) and germanium (Ge), and the semiconductor region composed of monocrystalline or polycrystalline silicon. The metal seed paste is fired to form a metal seed layer. A conductive contact for the semiconductor region of the solar cell is formed from the metal seed layer.

In yet another embodiment, a method of fabricating a solar cell involves forming a metal seed paste on a semiconductor region disposed in or above a substrate, the metal seed paste composed of aluminum/silicon (Al/Si) particles, and the semiconductor region composed of monocrystalline or polycrystalline silicon. The metal seed paste is fired to form a metal seed layer. A conductive contact for the semiconductor region of the solar cell is formed from the metal seed layer. The conductive contact has a specific contact resistivity less than approximately 12 mOhm·cm².

In a first aspect, one or more embodiments described herein are directed to the addition of magnesium (Mg) or tin (Sn), or like metals, to aluminum (Al) based metal pastes for cell metallization. In one such embodiment, an aluminum oxide ($Al_2O_3$) shell surrounding Al-based particles reacts with Mg to form a more permeable $MgAl_2O_4$, which enables particle-to-particle sintering processes. The electrical conductivity and mechanical adhesion and cohesion of the resulting film can thus be improved. In another embodiment, the addition of Sn is used to suppress formation of undesirable aluminum nitride (AlN), e.g., when Al is exposed to a nitrogen ambient during firing.

To provide context, screen printed cell metallization has been attempted using metal pastes based on pure Al and Al—Si alloy particles. When such a paste is in direct contact with silicon layers in the cell, the firing or sintering temperature is limited to below the Al—Si eutectic temperature (577 degrees Celsius) to prevent unwanted migration of the poly silicon into the paste metal matrix. At temperatures below 577 degrees Celsius, however, the mechanical interconnection of the Al particles to each other and to the substrate is typically weak, resulting in poor adhesion, cohesion and electrical sheet resistance of the sintered Al films. It is understood that a significant hindrance to successful sintering of Al and Al—Si particles is the formation of a hard and dense alumina ($Al_2O_3$) shell around the particles. The shell typically cannot be reduced in hydrogen gas, and can prevent metal to metal contacts between adjacent particles.

Addressing the above issues, embodiments described herein are directed to the use of Mg and Sn, or like metals, as sintering aids to be incorporated into an Al—Si particle alloy or added as elemental Mg and/or Sn particles into the paste. Mg can react with the alumina to form spinel ($MgAl_2O_4$), thus disrupting the continuity of the dense alumina shells around the particles, and enabling the sintering reactions to proceed. Since the alumina shell is typically only a few nanometers thick, only a relatively small amount of Mg is necessary, e.g., typically less than approximately 10% of the total mass of metal particles. When paste firing is performed in nitrogen, the formation of AlN may occur as the alumina shell is disrupted and highly reactive aluminum is exposed to nitrogen. AlN formation is typically detrimental to the mechanical and electrical properties of the fired films. When Sn is added to the paste, in one embodiment, it can form a liquid coating over the Al particles during firing and, thus, prevent nitridation of the aluminum. To suppress the formation of AlN, Sn may be added to the paste either as elemental Sn particles or incorporated into the Al—Si alloy, or even alloyed with Mg particles.

In a first exemplary cell, a seed layer is used to fabricate contacts, such as back-side contacts, for a solar cell having emitter regions formed above a substrate of the solar cell. For example, FIG. 1A illustrates a cross-sectional view of a portion of a solar cell having conductive contacts formed on emitter regions formed above a substrate, in accordance with an embodiment of the present disclosure.

Referring to FIG. 1A, a portion of a solar cell 100A includes a patterned (e.g., formed to have openings therein such as by blanket deposition and subsequent etching or ablation) dielectric layer 224 disposed above a plurality of n-type doped polysilicon regions 220, a plurality of p-type doped polysilicon regions 222, and on portions of a substrate 200 exposed by trenches 216. Conductive contacts 228 are disposed in a plurality of contact openings disposed in the dielectric layer 224 and are coupled to the plurality of n-type doped polysilicon regions 220 and to the plurality of p-type doped polysilicon regions 222. The materials of, and methods of fabricating, the patterned dielectric layer, the plurality of n-type doped polysilicon regions 220, the plurality of p-type doped polysilicon regions 222, the substrate 200, and the trenches 216 may be as described below in association with FIGS. 2A-2C.

Continuing with FIG. 1A, the plurality of n-type doped polysilicon regions 220 and the plurality of p-type doped polysilicon regions 222 can, in one embodiment, provide emitter regions for the solar cell 100A. Thus, in an embodiment, the conductive contacts 228 are disposed on the emitter regions. In an embodiment, the conductive contacts 228 are back contacts for a back-contact solar cell and are situated on a surface of the solar cell opposing a light receiving surface (direction provided as 201 in FIG. 1A) of the solar cell 100A. Furthermore, in one embodiment, the emitter regions are formed on a thin or tunnel dielectric layer 202, described in greater detail in association with FIG. 2A.

Referring again to FIG. 1A, each of the conductive contacts 228 includes a seed layer 130 in contact with the emitter regions of the solar cell 100A. In an embodiment, the seed layer 130 is composed of aluminum (Al) and a second, different, metal. In one such embodiment, the second metal is a reducing metal. For example, in a particular embodiment, the second metal is magnesium (Mg). In the final solar cell 100A, at least a portion of the Mg is in the form of $MgAl_2O_4$. In another particular embodiment, the reducing metal is zinc (Zn). In another embodiment, the second metal has a melting point less than the eutectic melting point of aluminum-silicon (Al—Si), e.g., less than approximately 577 degrees Celsius. For example, in a particular embodiment, the second metal is tin (Sn). In an embodiment, at least two metals are used in addition to Al. For example, both a reducing metal (e.g., Mg, Zn, etc.) and a metal having a melting point less than the eutectic melting point of Al—Si (e.g., Sn) are both used. In an embodiment, the Al is in the form of Al/silicon (Al/Si) particles. It is to be understood that the additional metals can be included in the Al/Si particles or as separated particles.

In an embodiment, the seed layer 130 has a thickness greater than approximately 30 microns, and the conductive contact 228 fabricated there from is a back contact of the solar cell composed essentially of only the conductive layer 130. However, in another embodiment, the conductive layer 130 has a thickness of approximately 2-10 microns. In that embodiment, the conductive contact 228 is a back contact of the solar cell and is composed of the conductive layer 130, a nickel (Ni) layer 132 disposed on the conductive layer 130, and a copper (Cu) layer 134 disposed on the Ni layer 132, as depicted in FIG. 1A.

In a second exemplary cell, a seed layer is used to fabricate contacts, such as back-side contacts, for a solar cell having emitter regions formed in a substrate of the solar cell. For example, FIG. 1B illustrates a cross-sectional view of a portion of a solar cell having conductive contacts formed on emitter regions formed in a substrate, in accordance with an embodiment of the present disclosure.

Figure 1B:
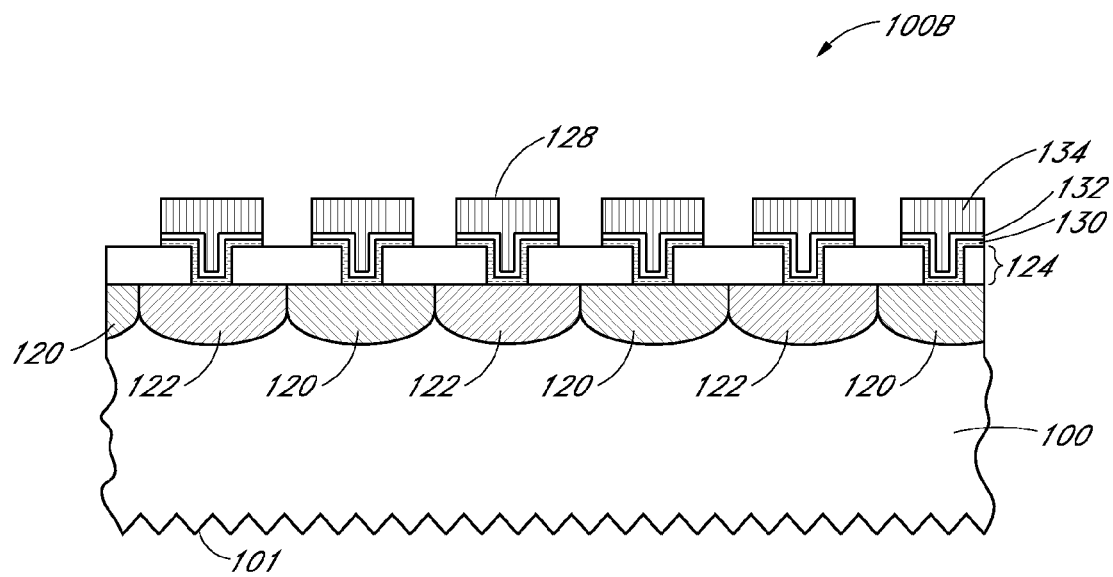
FIG. 1B illustrates a cross-sectional view of a portion of a solar cell having conductive contacts formed on emitter regions formed in a substrate, in accordance with an embodiment of the present disclosure.

Referring to FIG. 1B, a portion of a solar cell 100B includes a patterned dielectric layer 124 disposed above a plurality of n-type doped diffusion regions 120, a plurality of p-type doped diffusion regions 122, and on portions of a substrate 100, such as a bulk crystalline silicon substrate. Conductive contacts 128 are disposed in a plurality of contact openings disposed in the dielectric layer 124 and are coupled to the plurality of n-type doped diffusion regions 120 and to the plurality of p-type doped diffusion regions 122. In an embodiment, the diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for the solar cell 100B. Thus, in an embodiment, the conductive contacts 128 are disposed on the emitter regions. In an embodiment, the conductive contacts 128 are back contacts for a back-contact solar cell and are situated on a surface of the solar cell opposing a light receiving surface, such as opposing a texturized light receiving surface 101, as depicted in FIG. 1B. In an embodiment, referring again to FIG. 1B, each of the conductive contacts 128 includes a seed layer 130 in contact with the emitter regions of the solar cell 100B. The seed layer 130 may be similar or the same as seed layer 130 described in association with FIG. 1A. Furthermore, in some embodiments, the seed layer 130 is used as the conductive contact, while in other embodiments additional metal layers 132 and 134, such as Ni and Cu, are included in the contacts 128 (the latter depicted in FIG. 1B).

Although certain materials are described specifically above with reference to FIGS. 1A and 1B, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, silver (Ag) particles or the like can be used in a seed paste in addition to Al particles. In another embodiment, plated or like-deposited cobalt (Co) or tungsten (W) can be used instead of or in addition to the Ni layer described above.

Furthermore, the formed contacts need not be formed directly on a bulk substrate, as was described in FIG. 1B. For example, in one embodiment, conductive contacts such as those described above are formed on semiconducting regions formed above (e.g., on a back side of) as bulk substrate, as was described for FIG. 1A. As an example, FIGS. 2A-2C illustrate cross-sectional views of various processing operations in a method of fabricating solar cells having conductive contacts, in accordance with an embodiment of the present disclosure.

Figure 2A:
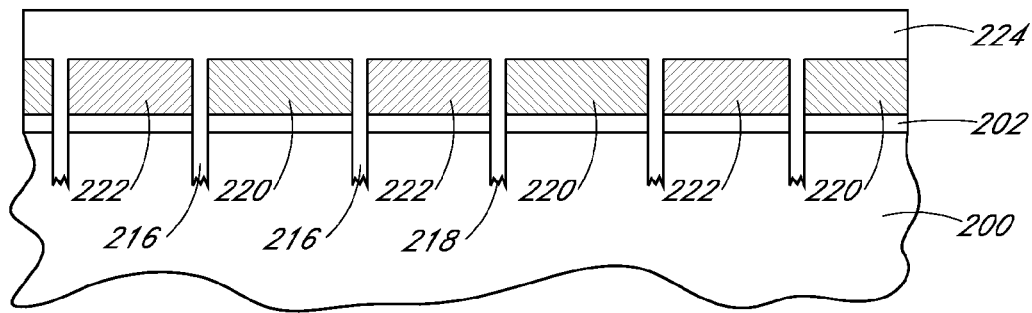
FIGS. 2A-2C illustrate cross-sectional views of various processing operations in a method of fabricating solar cells having conductive contacts, in accordance with embodiments of the present disclosure.
Figure 2B:
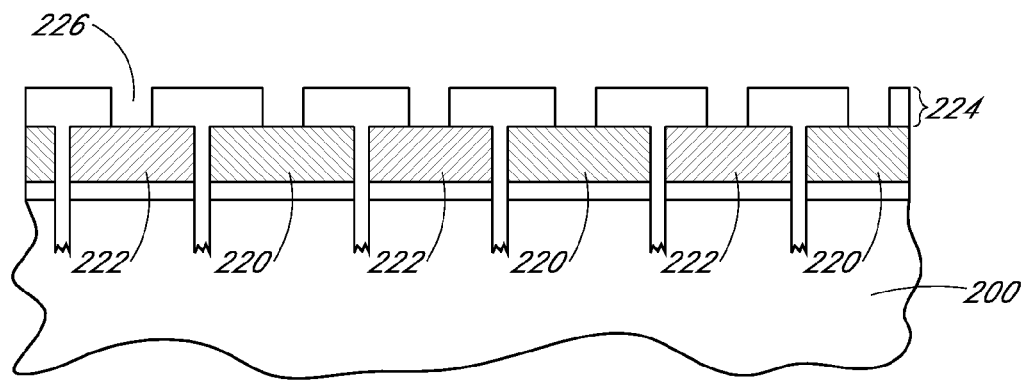
Figure 2C:
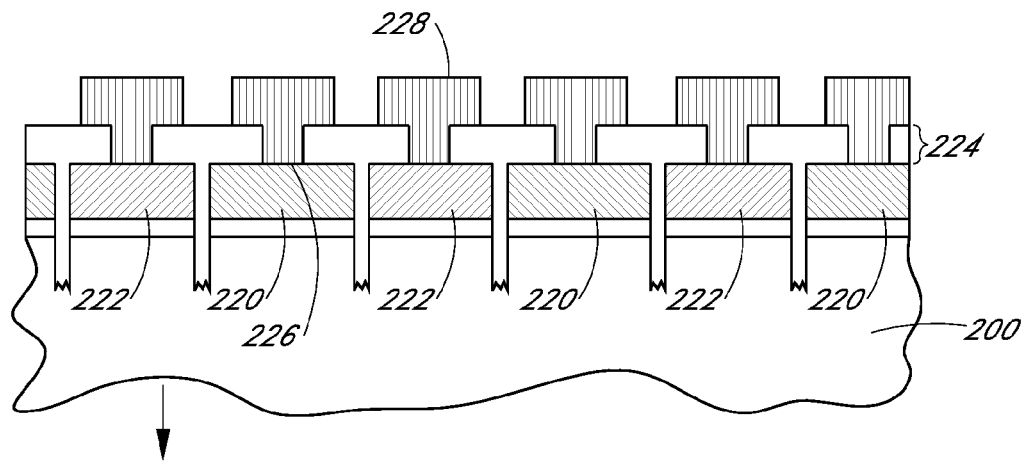

Referring to FIG. 2A, a method of forming contacts for a back-contact solar cell includes forming a thin dielectric layer 202 on a substrate 200.

In an embodiment, the thin dielectric layer 202 is composed of silicon dioxide and has a thickness approximately in the range of 5-50 Angstroms. In one embodiment, the thin dielectric layer 202 performs as a tunneling oxide layer. In an embodiment, substrate 200 is a bulk monocrystalline silicon substrate, such as an n-type doped monocrystalline silicon substrate. However, in an alternative embodiment, substrate 200 includes a polycrystalline silicon layer disposed on a global solar cell substrate.

Referring again to FIG. 2A, trenches 216 are formed between n-type doped polysilicon regions 220 and p-type doped polysilicon regions 222. Portions of the trenches 216 can be texturized to have textured features 218, as is also depicted in FIG. 2A. A dielectric layer 224 is formed above the plurality of n-type doped polysilicon regions 220, the plurality of p-type doped polysilicon regions 222, and the portions of substrate 200 exposed by trenches 216. In one embodiment, a lower surface of the dielectric layer 224 is formed conformal with the plurality of n-type doped polysilicon regions 220, the plurality of p-type doped polysilicon regions 222, and the exposed portions of substrate 200, while an upper surface of dielectric layer 224 is substantially flat, as depicted in FIG. 2A. In a specific embodiment, the dielectric layer 224 is designed to reflect light that has passed through the cell, back towards the substrate so that it has another opportunity to be absorbed by the cell. Although such a layer may be referred to as an anti-reflective coating (ARC) layer, in an embodiment, it performs as a reflective layer for applications herein.

Referring to FIG. 2B, a plurality of contact openings 226 is formed in the dielectric layer 224. The plurality of contact openings 226 provides exposure to the plurality of n-type doped polysilicon regions 220 and to the plurality of p-type doped polysilicon regions 222. In one embodiment, the plurality of contact openings 226 is formed by laser ablation. In one embodiment, the contact openings 226 to the n-type doped polysilicon regions 220 have substantially the same height as the contact openings to the p-type doped polysilicon regions 222, as depicted in FIG. 2B.

Referring to FIG. 2C, the method of forming contacts for the back-contact solar cell further includes forming conductive contacts 228 in the plurality of contact openings 226 and coupled to the plurality of n-type doped polysilicon regions 220 and to the plurality of p-type doped polysilicon regions 222. Thus, in an embodiment, conductive contacts 228 are formed on or above a surface of a bulk N-type silicon substrate 200 opposing a light receiving surface 201 of the bulk N-type silicon substrate 200. In a specific embodiment, the conductive contacts are formed on regions (222/220) above the surface of the substrate 200, as depicted in FIG. 2C.

Figure 6:
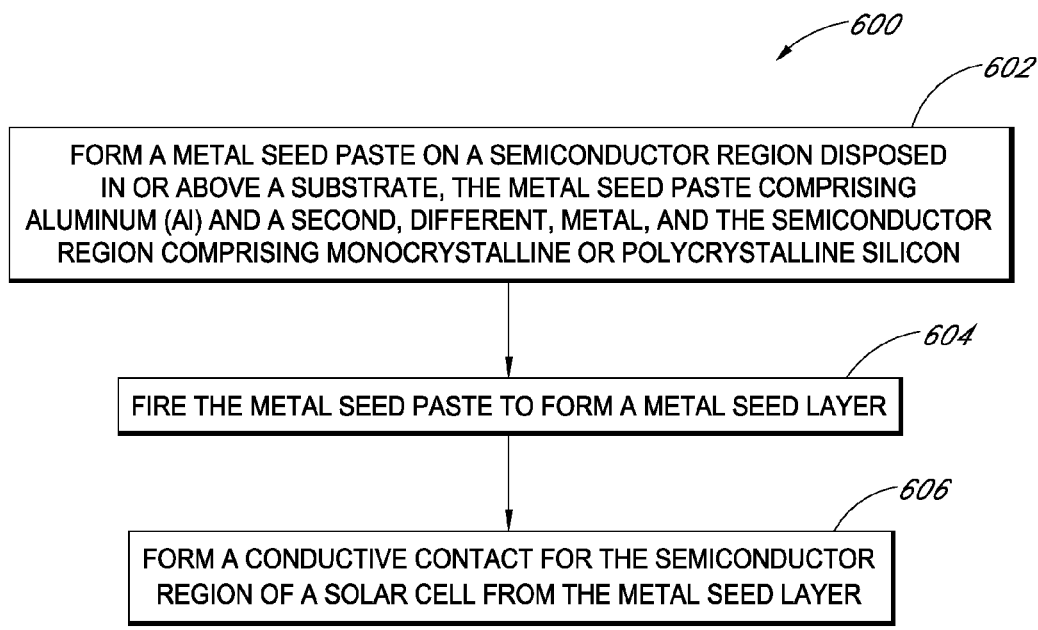
FIG. 6 is a flowchart illustrating operations in a method of fabricating a solar cell, in accordance with an embodiment of the present disclosure.

FIG. 6 is a flowchart 600 illustrating operations in a method of fabricating a solar cell, in accordance with an embodiment of the present disclosure. In an embodiment, referring to operation 602 of flowchart 600 and again to FIG. 2C, the conducive contacts 228 are fabricated by first applying a metal seed paste composed of aluminum (Al) and a second, different, metal. Referring to operation 604 of flowchart 600, the metal seed paste is fired to form a metal seed layer, e.g., by heating in a furnace or by laser annealing. Referring to operation 606 of flowchart 600, a conductive contact for the semiconductor regions 220 and 222 is then formed from the metal seed layer. In one such embodiment, the firing involves using the second metal for removing aluminum oxide ($Al_2O_3$) from the Al. In that embodiment, a reducing metal is used, such as Mg or Zn. In another embodiment, the firing is performed in a nitrogen atmosphere and involves using the second metal for suppressing formation of aluminum nitride (AlN). An example is the use of tin (Sn) as a melt metal that blocks the formation of AlN.

In an embodiment, forming the metal seed paste involves printing a paste composed of particles. In one such embodiment, the Al, plus silicon (Si), and the second metal are included in each of the particles. In another such embodiment, the paste is composed of a first plurality of particles and a second plurality of particles. The Al and silicon (Si) are included in each of the first plurality of particles (e.g., as Al/Si particles), and the second metal is included in each of the second plurality of particles but not in the first plurality of particles. It is to be understood that the fired seed layer may be used on its own to form conductive contacts; in such cases, the conductive layer is still referred to herein as a seed layer. Alternatively, forming the conductive contacts further involves plating a nickel (Ni) layer on the metal seed layer, and electroplating a copper (Cu) layer on the Ni layer, e.g., to form structures such as those described in association with FIGS. 1A and 1B. In yet another alternative embodiment, forming the conductive contacts further involves electroplating a copper (Cu) layer directly on the metal seed layer.

In a second aspect, one or more embodiments described herein are directed to the use of an aluminum-germanium (Al/Ge) alloy or aluminum-germanium-silicon (Al/Ge/Si) alloy particles as the main component of a printed seed paste for use in the metallization of silicon solar cells. Firing of such a paste can be used to make good electrical connection. The addition of germanium to aluminum reduces the melting temperature of the alloy to allow for coalescence of the particles for good electrical connection in the film and to the emitter, without damaging the underlying silicon solar cell. The eutectic melting temperature of the germanium containing alloy is lower than the eutectic melting temperature of an aluminum-silicon alloy, thus the particles can be melted without alloying significant volumes of the underlying silicon with the particles. Addition of silicon into the aluminum-germanium particles can further protect from silicon damage, since the silicon in the particles can dissolve and saturate the alloy with silicon, and thus mitigate diffusion of silicon from the substrate or emitter into the alloy.

To provide context, aluminum particles are being implemented as a main conductive material component for a printed seed paste used in a solar cell metallization processes. Aluminum was selected because it is inexpensive and has good conductivity. Firing of the paste is needed to coalesce or sinter the particles to create good electrical connection. The melting temperature of Al is 660 degrees Celsius and the aluminum-silicon eutectic temperature is 577° C., so achieving good coalescence between particles and to the underlying emitter structure is difficult without significant diffusion of silicon into the aluminum, which degrades the performance of the underlying silicon solar cell. If the firing is not performed at high enough temperature, then the particles do not connect well to each other or to the emitter and high series resistance can result. If the firing is performed at too high of a temperature the silicon will diffuse into the aluminum and the lifetime can be degraded. There can also be an issue of poor adhesion with non-coalesced particles resulting in delamination of the metallized film from the solar cell.

Addressing the above issues, embodiments described herein are directed to the use of an aluminum-germanium alloy or aluminum-germanium-silicon alloy particles as the main component of a printed seed paste for use in the metallization of silicon solar cells. Aluminum has a melting temperature of 660 degrees Celsius, but when germanium is added at about 28.4 atomic %, the melting temperature of the alloy (or eutectic temperature) becomes 420 degrees Celsius. This significant reduction in melting temperature can, in an embodiment, be used to allow for coalescence of the particles at firing temperatures that do not degrade the lifetime of the underlying silicon solar cell. Additionally, aluminum can dissolve silicon at temperatures lower than 660 degrees Celsius since the aluminum can also form a eutectic with silicon at 577 degrees Celsius with a silicon concentration of 12.2 atomic %. In an embodiment, silicon is added into the aluminum-germanium particles (e.g., on the order of 12.2 atomic percent Si or greater) to further protect from silicon damage, since the silicon in the particles dissolves prior to significant attack of underlying silicon. Possible particle forms include, in an embodiment, an aluminum-germanium-silicon containing particle with approximately 60 atomic % Al, 28 atomic % Ge, and 12.2 atomic % Si. The particles can be fabricated by gas atomization or additionally processed using ball milling to reduce the particle size below 1 micron.

As an example, with reference again to FIGS. 1A and 1B, each of the conductive contacts 228 or 128, respectively, includes a seed layer 130 in contact with the emitter regions of the solar cell 100A. In an embodiment, the seed layer 130 is composed of aluminum (Al) and germanium (Ge). In one such embodiment, the seed layer includes an amount of Ge relative to Al at or greater than a eutectic composition of Al/Ge. In one embodiment, the Al and Ge is in the form of Al/Ge particles. In one embodiment, the Al/Ge particles further include silicon (Si) as Al/Ge/Si particles. In a particular such embodiment, the Al/Ge/Si particles have an atomic ratio of approximately 60:28:12.

The above described seed layer 130 can, in an embodiment, have a thickness greater than approximately 30 microns, and the conductive contacts 128 or 228 fabricated there from are composed essentially of only the conductive layer 130. However, in another embodiment, the conductive layer 130 has a thickness of approximately 2-10 microns. In that embodiment, the conductive contacts 128 or 228 are composed of the conductive layer 130, a nickel (Ni) layer 132 disposed on the conductive layer 130, and a copper (Cu) layer 134 disposed on the Ni layer 132, as depicted in FIGS. 1A and 1B.

Figure 7:
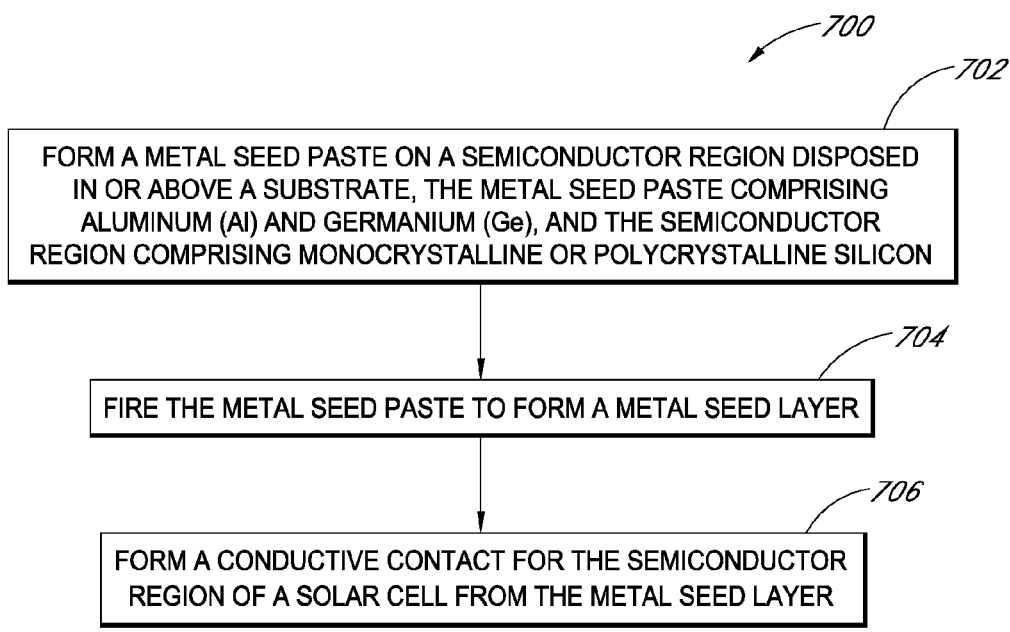
FIG. 7 is a flowchart illustrating operations in a method of fabricating a solar cell, in accordance with an embodiment of the present disclosure.

FIG. 7 is a flowchart 700 illustrating operations in a method of fabricating a solar cell, in accordance with an embodiment of the present disclosure. With reference to operation 702 of flowchart 700 and again to FIG. 2C, in an embodiment, the conductive contacts 228 are fabricated by first applying a metal seed paste composed of aluminum (Al) and germanium (Ge). Referring to operation 704 of flowchart 700, the metal seed paste is fired to form a metal seed layer, e.g., by heating in a furnace or by laser annealing. Referring to operation 706 of flowchart 700, a conductive contact for the semiconductor regions 220 and 222 is then formed from the metal seed layer. In one such embodiment, the firing involves using the Ge to substantially prevent reaction between the Al and the monocrystalline or polycrystalline silicon. In another embodiment, the firing is performed to generate a localized heating of the metal seed paste of a temperature sufficiently low to substantially prevent reaction between the Al and the monocrystalline or polycrystalline silicon during the firing. In another embodiment, the firing is performed to generate a localized heating of the metal seed paste of a temperature less than the eutectic melting point of aluminum-silicon (Al—Si) of approximately 577 degrees Celsius. In an embodiment, forming the metal seed paste involves printing a paste including particles. The Al and Ge are included in the particles. It is to be understood that the fired seed layer may be used on its own to form conductive contacts. For example, Al/Ge or Al/Si/Ge particles could be used for the full current carrying structure or contact finger if oxidation can be prevented; in such cases, the conductive layer is still referred to herein as a seed layer. Alternatively, forming the conductive contacts further involves plating a nickel (Ni) layer on the metal seed layer, and electroplating a copper (Cu) layer on the Ni layer, e.g., to form structures such as those described in association with FIGS. 1A and 1B. In yet another alternative embodiment, forming the conductive contacts further involves electroplating a copper (Cu) layer directly on the metal seed layer.

Figure 3A:
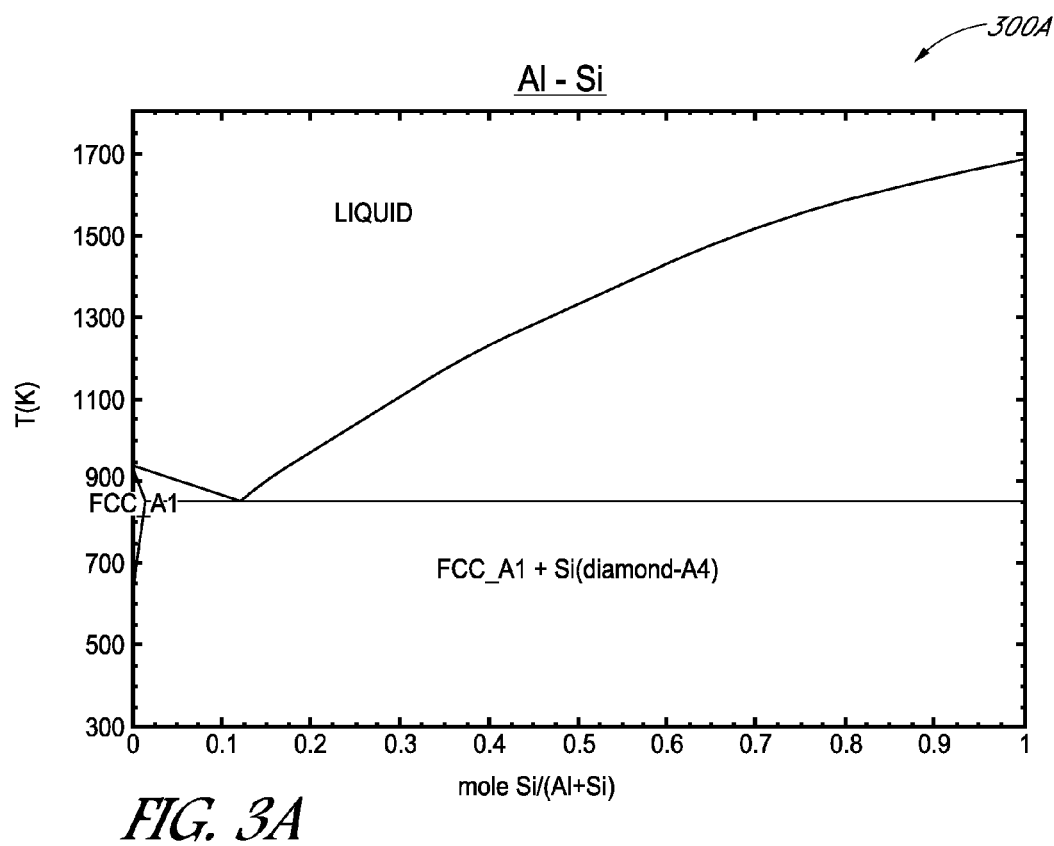
FIG. 3A is a plot of temperature (in Kelvin) as a function of mole Si/(Al+Si) composition for a mixture of silicon and aluminum, in accordance with an embodiment of the present disclosure.
Figure 3B:
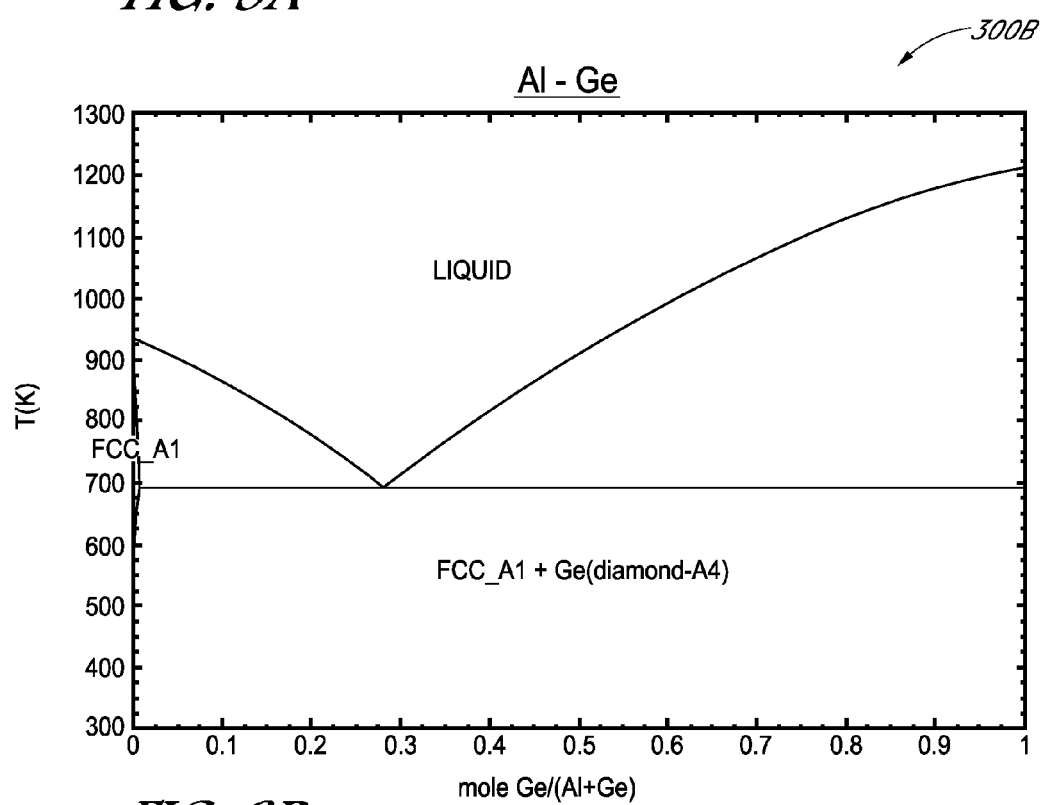
FIG. 3B is a plot of temperature (in Kelvin) as a function of mole Ge/(Al+Ge) composition for a mixture of germanium and aluminum, in accordance with an embodiment of the present disclosure.
Figure 3C:
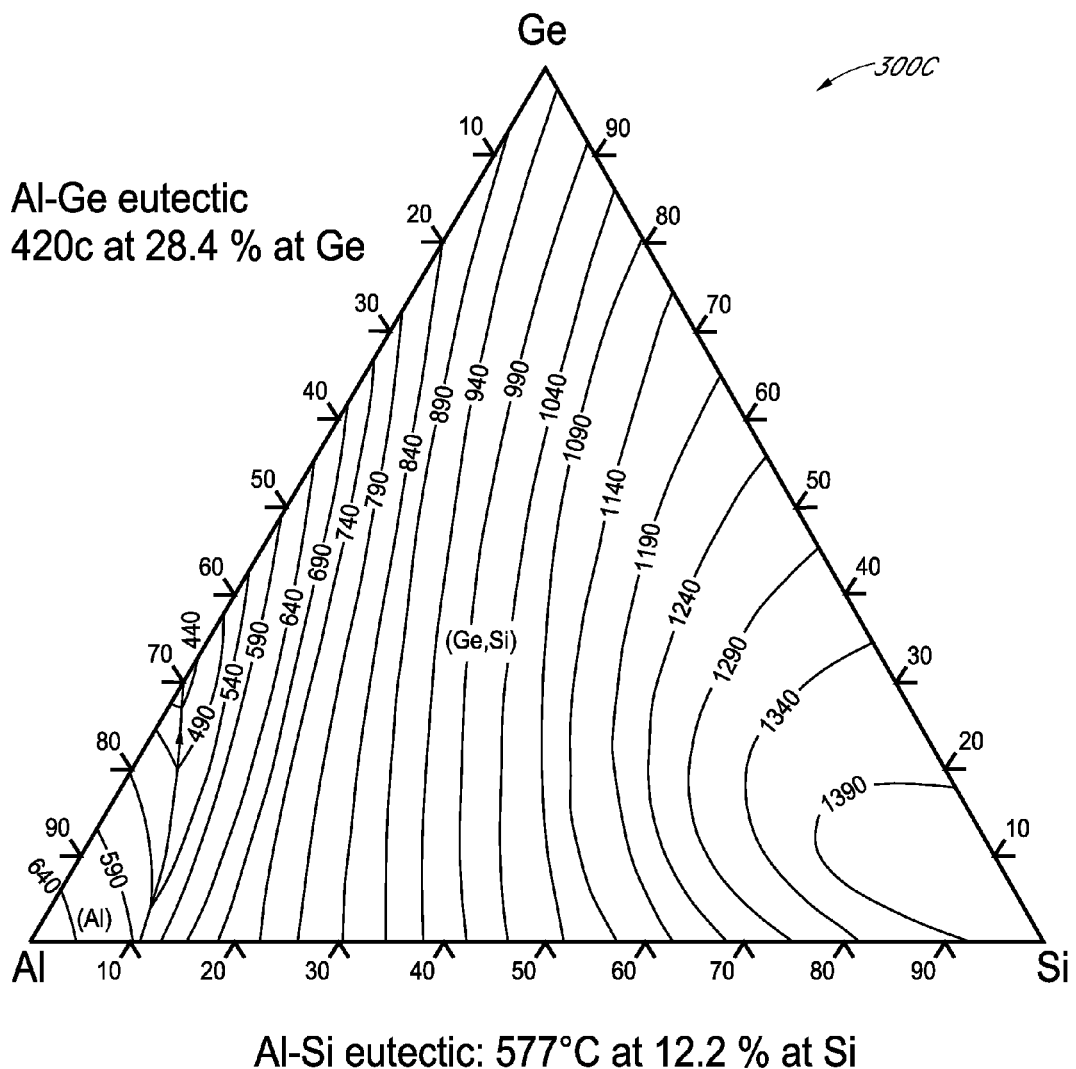
FIG. 3C is an Al—Ge—Si ternary phase diagram (in Celsius), in accordance with an embodiment of the present disclosure.

As an illustration of several of the concepts involved herein, FIG. 3A is a plot 300A of temperature (in Kelvin) as a function of mole Si/(Al+Si) composition for a mixture of silicon and aluminum, while FIG. 3B is a plot 300B of temperature (in Kelvin) as a function of mole Ge/(Al+Ge) composition for a mixture of germanium and aluminum, in accordance with an embodiment of the present disclosure. Referring collectively to FIGS. 3A and 3B, mixtures of elements (eutectics) can have lower melting temperatures than pure metals. An example is aluminum-silicon, which can cause silicon pitting in an emitter region if exposed to temperatures above the eutectic temperature of 577 degrees Celsius due to easy exchange of Si in an Al—Si melt and non-uniform Si composition in the particles. Aluminum-germanium is an alternative with a lower eutectic temperature (e.g., 420 degrees Celsius at 28.4 at % Ge). The Al—Ge alloy may allow for particle reflow for good contact to emitter and particle-to-particle without scavenging a significant amount of silicon. FIG. 3C is a Al—Ge—Si ternary phase diagram 300C (in Celsius), in accordance with an embodiment of the present disclosure. Analyzing the ternary system indicates that the Al—Ge eutectic dissolves silicon at higher temperatures than 420 degrees Celsius, but the amount is gradually dependent on temperature. In one such embodiment, then, ternary Al—Ge—Si particles are used for a contact paste of $Al_X$—$Ge_{>28.4\%}$—$Si_{<12\%}$ to prevent detriment to an underlying Si-based emitter region.

In a third aspect, one or more embodiments described herein are directed to using small particles and/or flake particles as A/Si particles for a paste in order to increase the actual contact area between the particles and silicon. Also, particles with certain size distribution (e.g., a bi-modal distribution) can be used to further increase contact area and particle packing. Additional conductive binder (or frit) can be used in the paste to improve contact resistivity and charge transport within the paste.

To provide context, contact resistivity between paste to silicon is usually high. One of the main reasons is actual contact area ratio. When spherical particles are used in the paste, the actual contact area between particles and a flat silicon surface is a small percentage of nominal contact area, e.g., roughly 1%-10% depending on contact interface characteristics. Also, there can be voids between particles even when the particles are closely packed. Such voids can cause other process issues, such as trapping plating chemistry. Furthermore, the void within the paste can be detrimental in consideration for paste cohesion and adhesion to wafer.

Addressing the above issues, embodiments described herein are directed to the using small particles and/or flake particles. The actual contact area between particle and silicon can be increased for a given nominal contact area, which aids to reduce contact resistivity between paste and silicon. Also, particles with a certain size distribution (e.g., bi-modal distribution) can be used such that the smaller particles fit in the gaps formed between even closely-packed larger particles, further increasing contact area. Using small particles and/or flake particles, particle packing density is improved so that voids become smaller, making the voids easier to fill by subsequent processes such as electroless Ni deposition. Small void space and filled voids and potential can improve paste cohesion because of improved paste integration and paste adhesion to a wafer surface due to increased contact area. In an additional aspect embodiment, binder can be another important component within the paste which helps hold the paste together and also hold the paste on silicon surface. A conductive binder (or frit) can be used in the paste, such that contact resistivity between paste and silicon is reduced, and to facilitate charge transport within the paste. Thus, additional improvements include improved contact resistivity between paste and silicon, and also particle packing.

As an example, with reference again to FIGS. 1A and 1B, each of the conductive contacts 228 or 128, respectively, includes a seed layer 130 in contact with the emitter regions of the solar cell 100A. In an embodiment, the seed layer 130 is composed of aluminum/silicon (Al/Si) particles, and the resulting conductive contact has a specific contact resistivity less than approximately 12 mOhm·cm². In one such embodiment, the Al/Si particles have a total population with at least 90% of the total population having a diameter of less than approximately 5 microns. In a specific such embodiment, the total population has a median of approximately 3 microns. In another embodiment, a majority of the Al/Si particles are substantially non-spherical. In a specific such embodiment, the majority of the Al/Si particles have a flake-like geometry. In another embodiment, the Al/Si particles have a total population with a bimodal distribution of diameters.

The above described seed layer 130 can, in an embodiment, have a thickness greater than approximately 30 microns, and the conductive contacts 128 or 228 fabricated there from are composed essentially of only the conductive layer 130. However, in another embodiment, the conductive layer 130 has a thickness of approximately 2-10 microns. In that embodiment, the conductive contacts 128 or 228 are composed of the conductive layer 130, a nickel (Ni) layer 132 disposed on the conductive layer 130, and a copper (Cu) layer 134 disposed on the Ni layer 132, as depicted in FIGS. 1A and 1B.

Figure 8:
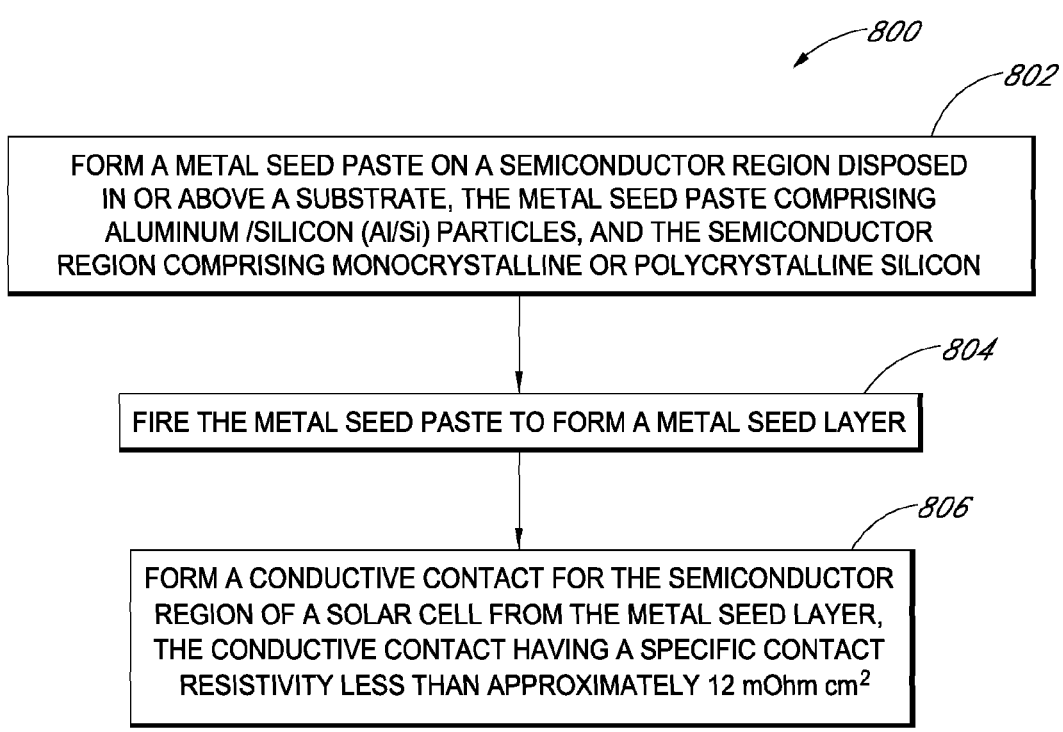
FIG. 8 is a flowchart illustrating operations in a method of fabricating a solar cell, in accordance with an embodiment of the present disclosure.

FIG. 8 is a flowchart 800 illustrating operations in a method of fabricating a solar cell, in accordance with an embodiment of the present disclosure. With reference to operation 802 of flowchart 800 and again to FIG. 2C, in an embodiment, the conductive contacts 228 are fabricated by first applying a metal seed paste composed of aluminum/silicon (Al/Si) particles. Referring to operation 804 of flowchart 800, the metal seed paste is fired to form a metal seed layer, e.g., by heating in a furnace or by laser annealing. Referring to operation 804 of flowchart 800, a conductive contact for the semiconductor regions 220 and 222 is then formed from the metal seed layer, the conductive contact having a specific contact resistivity less than approximately 12 mOhm·cm². In one such embodiment, the Si of the Al/Si particles substantially prevents reaction between the Al and the monocrystalline or polycrystalline silicon during the firing. In one embodiment, forming the metal seed paste involves printing the metal seed paste where the Al/Si particles of the metal seed paste have a total population with at least 90% of the total population having a diameter of less than approximately 5 microns. In one embodiment, forming the metal seed paste involves printing the metal seed paste where a majority of the Al/Si particles are substantially non-spherical. In one embodiment, forming the metal seed paste involves printing the metal seed paste where the Al/Si particles have a total population with a bimodal distribution of diameters. It is to be understood that the fired seed layer may be used on its own to form conductive contacts; in such cases, the conductive layer is still referred to herein as a seed layer. Alternatively, forming the conductive contacts further involves plating a nickel (Ni) layer on the metal seed layer, and electroplating a copper (Cu) layer on the Ni layer, e.g., to form structures such as those described in association with FIGS. 1A and 1B. In yet another alternative embodiment, forming the conductive contacts further involves electroplating a copper (Cu) layer directly on the metal seed layer.

Figure 4:
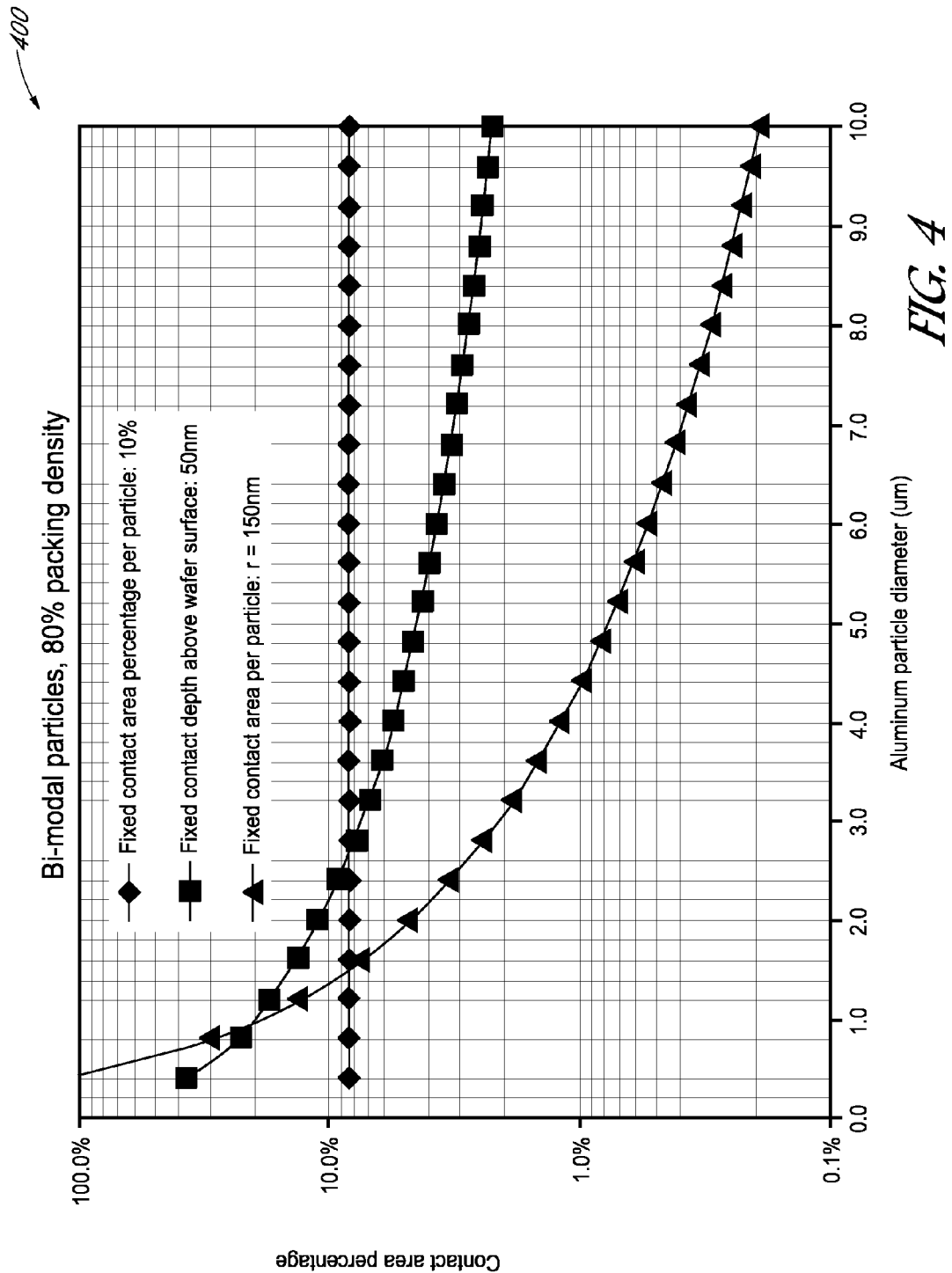
FIG. 4 is a plot of contact area percentage as a function of aluminum particle diameter (in microns) for bi-modal particles having 80% packing density, in accordance with an embodiment of the present disclosure.

As an illustration of several of the concepts involved herein, FIG. 4 is a plot 400 of contact area percentage as a function of aluminum particle diameter (in microns) for bi-modal particles having 80% packing density, in accordance with an embodiment of the present disclosure. Referring to FIG. 4, the real contact area is about 1%-10% for 2-7 micron particles. Given a measured specific contact resistivity of 10 mohm-cm$^2$, the real specific contact resistivity is approximately $10^{-3}$-$10^{-4}$ ohm-cm$^2$, which is about 10 times higher than that of PVD Al film. In an embodiment, then, moving to smaller particles helps increasing real contact area.

Figure 5:
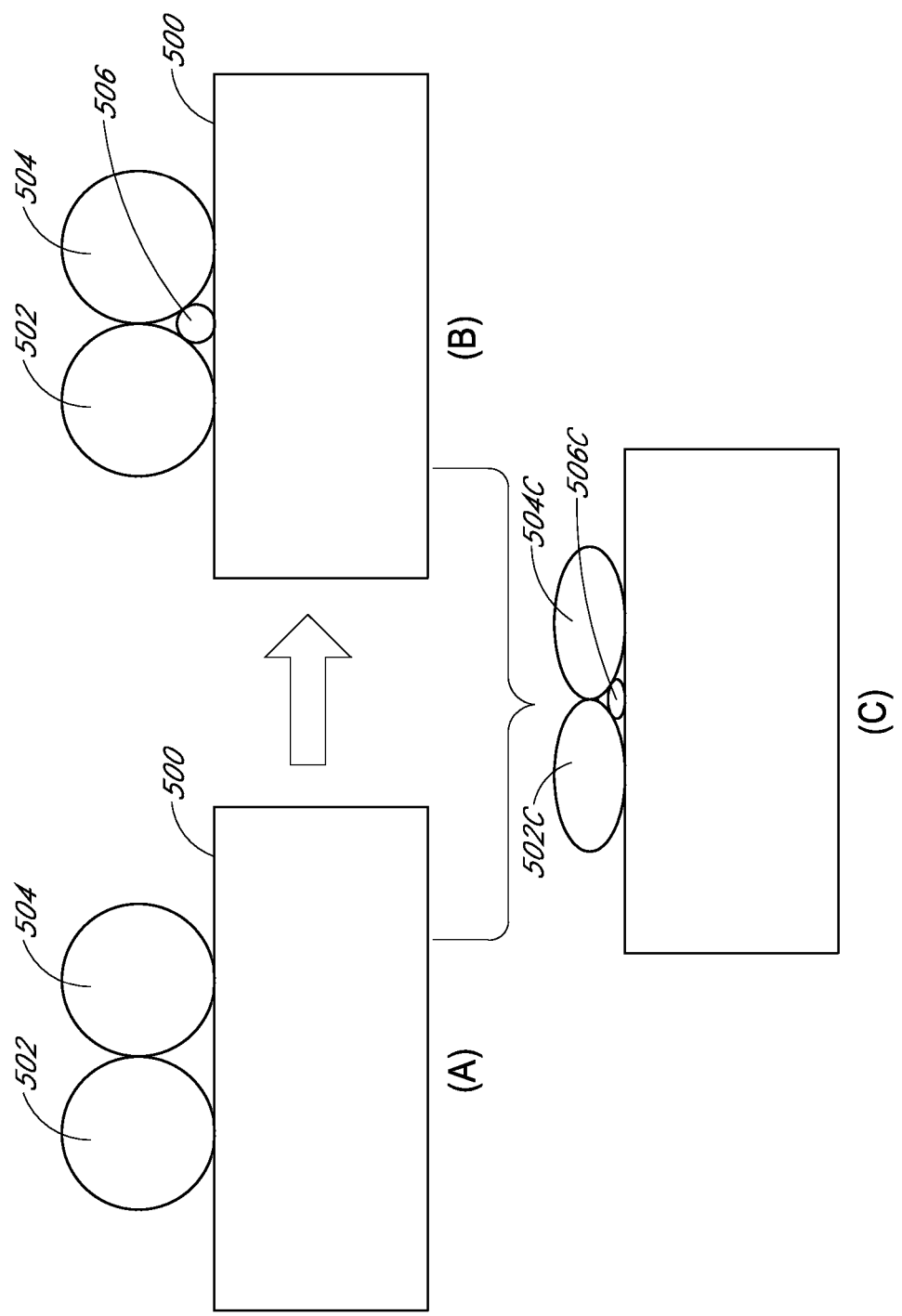
FIG. 5 illustrates cross-sectional views of conductive particles on a substrate surface where (A) conventional same size, spherical particles are used, (B) differing sized, spherical particles are used, and (C) differing sized, non-spherical particles are used, in accordance with an embodiment of the present disclosure.

FIG. 5 illustrates cross-sectional views of conductive particles on a substrate surface where (A) conventional same size, spherical particles are used, (B) differing sized, spherical particles are used, and (C) differing sized, non-spherical particles are used, in accordance with an embodiment of the present disclosure. Referring to FIG. 5 generally, in an embodiment, contact resistivity and particle packing is improved by using small particles and/or flake particles. In part (A), closely-packed particles 502 and 504 are disposed above substrate, but packing density is limited since they are spherical and are approximately the same size. The actual contact area is small and large voids can be present void. In (B), a bi-modal size distribution helps increase actual contact area and particle packing density with the addition of smaller particles 506 co-packed with 502 and 504. In (C), the particles of (B) are all shown as distorted, e.g., in the form of flakes 502C, 504C and 506C. The flake geometry of the particles aids in increasing the actual contact area and particle packing density.

Generally, as used in embodiments throughout, a formed paste layer (e.g., a deposited paste formed by printing) can further include a solvent for ease of delivery. The printing can includes using a technique such as, but not limited to, screen printing or inkjet printing. Additionally, pastes described herein may include other elements such as binders or frit, within the spirit and scope of embodiments described herein.

Thus, metal seed layers for solar cell conductive contacts and methods of forming metal seed layers for solar cell conductive contacts have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

In an embodiment, a solar cell includes a substrate. A semiconductor region is disposed in or above the substrate. A conductive contact is disposed on the semiconductor region and includes a seed layer in contact with the semiconductor region, the seed layer composed of aluminum (Al) and a second, different, metal.

In one embodiment, the second metal is a reducing metal.

In one embodiment, the second metal is magnesium (Mg), at least a portion of which is in the form of $MgAl_2O_4$.

In one embodiment, the second metal has a melting point less than the eutectic melting point of aluminum-silicon (Al—Si).

In one embodiment, the second metal is tin (Sn) or zinc (Zn).

In one embodiment, the Al is in the form of Al/silicon (Al/Si) particles.

In one embodiment, the semiconductor region is a polycrystalline silicon layer of an emitter region disposed above the substrate.

In one embodiment, the semiconductor region is a diffusion region disposed in the substrate, and the substrate is a monocrystalline silicon substrate.

In one embodiment, the solar cell is a back-contact solar cell.

In an embodiment, a method of fabricating a solar cell involves forming a metal seed paste on a semiconductor region disposed in or above a substrate, the metal seed paste composed of aluminum (Al) and a second, different, metal, and the semiconductor region is composed of monocrystalline or polycrystalline silicon. The method also involves firing the metal seed paste to form a metal seed layer. The method also involves forming a conductive contact for the semiconductor region of the solar cell from the metal seed layer.

In one embodiment, the firing involves using the second metal for removing aluminum oxide ($Al_2O_3$) from the Al.

In one embodiment, the firing is performed in a nitrogen atmosphere and involves using the second metal for suppressing formation of aluminum nitride (AlN).

In one embodiment, forming the metal seed paste involves printing a paste including particles, and the Al, silicon (Si), and the second metal are included in each of the particles.

In one embodiment, forming the metal seed paste involves printing a paste including a first plurality of particles and a second plurality of particles. The Al and silicon (Si) are included in each of the first plurality of particles, and the second metal is included in each of the second plurality of particles but not in the first plurality of particles.

In one embodiment, forming the conductive contact further involves plating a nickel (Ni) layer on the metal seed layer. The method also involves electroplating a copper (Cu) layer on the Ni layer.

In one embodiment, forming the conductive contact further involves forming a copper (Cu) layer directly on the metal seed layer.

In an embodiment, a solar cell includes a substrate. A semiconductor region is disposed in or above the substrate. A conductive contact is disposed on the semiconductor region and includes a seed layer in contact with the semiconductor region. The seed layer includes aluminum (Al) and germanium (Ge).

In one embodiment, the seed layer is composed of an amount of Ge relative to Al at or greater than a eutectic composition of Al/Ge.

In one embodiment, the Al and Ge is in the form of Al/Ge particles.

In one embodiment, the Al/Ge particles further include silicon (Si) as Al/Ge/Si particles.

In one embodiment, the Al/Ge/Si particles have an atomic ratio of approximately 60:28:12.

In one embodiment, the semiconductor region is a polycrystalline silicon layer of an emitter region disposed above the substrate.

In one embodiment, the semiconductor region is a diffusion region disposed in the substrate, and the substrate is a monocrystalline silicon substrate.

In one embodiment, the solar cell is a back-contact solar cell.

In an embodiment, a method of fabricating a solar cell involves forming a metal seed paste on a semiconductor region disposed in or above a substrate, the metal seed paste including aluminum (Al) and germanium (Ge), and the semiconductor region including monocrystalline or polycrystalline silicon. The method also involves firing the metal seed paste to form a metal seed layer. The method also involves forming a conductive contact for the semiconductor region of the solar cell from the metal seed layer.

In one embodiment, the firing involves using the Ge to substantially prevent reaction between the Al and the monocrystalline or polycrystalline silicon.

In one embodiment, the firing is performed to generate a localized heating of the metal seed paste of a temperature sufficiently low to substantially prevent reaction between the Al and the monocrystalline or polycrystalline silicon during the firing.

In one embodiment, the firing is performed to generate a localized heating of the metal seed paste of a temperature less than the eutectic melting point of aluminum-silicon (Al—Si).

In one embodiment, forming the metal seed paste involves printing a paste having particles, and the Al and Ge are included in the particles.

In one embodiment, forming the conductive contact further involves plating a nickel (Ni) layer on the metal seed layer, and electroplating a copper (Cu) layer on the Ni layer.

In one embodiment, forming the conductive contact further involves forming a copper (Cu) layer directly on the metal seed layer.

In an embodiment, a solar cell includes a substrate. A semiconductor region is disposed in or above the substrate. A conductive contact is disposed on the semiconductor region and includes a seed layer in contact with the semiconductor region. The seed layer includes aluminum/silicon (Al/Si) particles, and the conductive contact has a specific contact resistivity less than approximately 12 mOhm·cm$^2$.

In one embodiment, the Al/Si particles have a total population with at least 90% of the total population having a diameter of less than approximately 5 microns.

In one embodiment, the total population has a median of approximately 3 microns.

In one embodiment, a majority of the Al/Si particles are substantially non-spherical.

In one embodiment, the majority of the Al/Si particles have a flake-like geometry.

In one embodiment, the Al/Si particles have a total population with a bimodal distribution of diameters.

In one embodiment, the semiconductor region is a polycrystalline silicon layer of an emitter region disposed above the substrate.

In one embodiment, the semiconductor region is a diffusion region disposed in the substrate, and the substrate is a monocrystalline silicon substrate.

In one embodiment, the solar cell is a back-contact solar cell.

In an embodiment, a method of fabricating a solar cell involves forming a metal seed paste on a semiconductor region disposed in or above a substrate, the metal seed paste having aluminum/silicon (Al/Si) particles, and the semiconductor region including monocrystalline or polycrystalline silicon. The method also involves firing the metal seed paste to form a metal seed layer. The method also involves forming a conductive contact for the semiconductor region of the solar cell from the metal seed layer, the conductive contact having a specific contact resistivity less than approximately 12 mOhm·cm$^2$.

In one embodiment, the Si of the Al/Si particles substantially prevents reaction between the Al and the monocrystalline or polycrystalline silicon during the firing.

In one embodiment, forming the metal seed paste involves printing the metal seed paste where the Al/Si particles of the metal seed paste have a total population with at least 90% of the total population having a diameter of less than approximately 5 microns.

In one embodiment, forming the metal seed paste involves printing the metal seed paste where a majority of the Al/Si particles are substantially non-spherical.

In one embodiment, forming the metal seed paste involves printing the metal seed paste where the Al/Si particles have a total population with a bimodal distribution of diameters.

In one embodiment, forming the conductive contact further involves plating a nickel (Ni) layer on the metal seed layer, and electroplating a copper (Cu) layer on the Ni layer.

In one embodiment, forming the conductive contact further involves forming a copper (Cu) layer directly on the metal seed layer.

What is claimed is:

1. A solar cell, comprising:
   a substrate;
   a semiconductor region disposed in or above the substrate; and
   a conductive contact disposed on the semiconductor region and comprising a seed layer in contact with the semiconductor region, the seed layer comprising aluminum (Al) and a second, different, metal;
   wherein the second metal is magnesium (Mg), at least a portion of which is in the form of $MgAl_2O_4$.

2. The solar cell of claim 1, wherein the second metal has a melting point less than the eutectic melting point of aluminum-silicon (Al—Si).

3. The solar cell of claim 1, wherein the semiconductor region is a polycrystalline silicon layer of an emitter region disposed above the substrate.

4. The solar cell of claim 1, wherein the semiconductor region is a diffusion region disposed in the substrate, and wherein the substrate is a monocrystalline silicon substrate.

5. The solar cell of claim 1, wherein the solar cell is a back-contact solar cell.

6. A back contact solar cell, comprising:
   a substrate;

a semiconductor region disposed in or above the substrate;

a conductive contact disposed on the semiconductor region and comprising a seed layer in contact with the semiconductor region, the seed layer comprising aluminum (Al) and a second metal selected from the group consisting of magnesium (Mg), tin (Sn) and zinc (Zn), wherein the Al is in the form of Al/silicon (Al/Si) particles, and wherein the conductive contact further comprises a first metal layer disposed on the seed layer and a second metal layer disposed on the first metal layer;

wherein the seed layer further comprises germanium (Ge).

7. The back contact solar cell of claim 6, wherein the second metal is a reducing metal.

8. The back contact solar cell of claim 6, wherein the second metal has a melting point less than the eutectic melting point of aluminum-silicon (Al—Si).

* * * * *